(12) United States Patent
Gardner et al.

(10) Patent No.: US 12,317,481 B2
(45) Date of Patent: May 27, 2025

(54) 3D MEMORY WITH CELL STACKING USING AN IN-SITU CAPACITOR STACK

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 489 days.

(21) Appl. No.: 17/946,715

(22) Filed: Sep. 16, 2022

(65) Prior Publication Data

US 2023/0301058 A1 Sep. 21, 2023

Related U.S. Application Data

(60) Provisional application No. 63/320,464, filed on Mar. 16, 2022.

(51) Int. Cl.
*H01L 27/108* (2006.01)
*H10B 12/00* (2023.01)

(52) U.S. Cl.
CPC ............ *H10B 12/30* (2023.02); *H10B 12/03* (2023.02); *H10B 12/05* (2023.02)

(58) Field of Classification Search
CPC ........ H10B 12/30; H10B 12/03; H10B 12/05; H10D 30/6755; H10D 86/481; H10D 86/60
See application file for complete search history.

(56) References Cited

U.S. PATENT DOCUMENTS

| 2022/0208766 A1* | 6/2022 | Kim | H10B 12/488 |
| 2023/0005934 A1* | 1/2023 | Kim | G11C 11/4085 |
| 2023/0048424 A1* | 2/2023 | Kim | H10D 30/6757 |

* cited by examiner

*Primary Examiner* — Mohammed R Alam
(74) *Attorney, Agent, or Firm* — Oblon, McClelland, Maier & Neustadt, L.L.P.

(57) ABSTRACT

A semiconductor device includes a stack of dynamic random access memory (DRAM) cell units over a substrate in a vertical direction. At least one DRAM cell unit includes a transistor and a capacitor. The capacitor includes a first metal layer, a capacitor dielectric layer on the first metal layer, and a second metal layer on the capacitor dielectric layer. The capacitor is elongated in a horizontal direction. The first metal layer has a first end and a second end in the horizontal direction. The transistor includes a channel structure, and a gate structure on the channel structure. The second metal layer extends in the horizontal direction beyond the first end of the first metal layer to form a drain region and a source region of the transistor. A common ground structure is configured to electrically connect to a plurality of first metal layers on respective second ends.

19 Claims, 14 Drawing Sheets

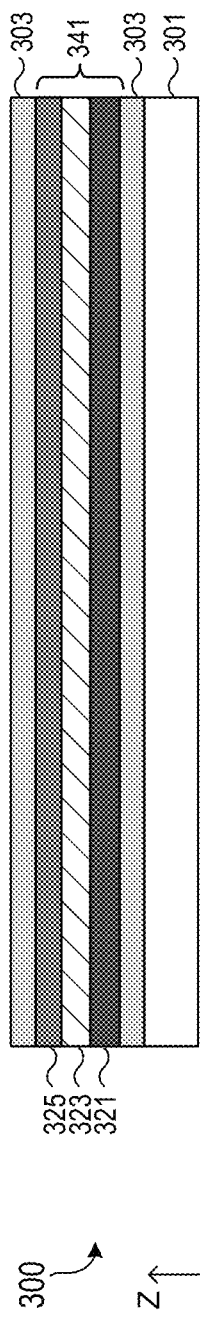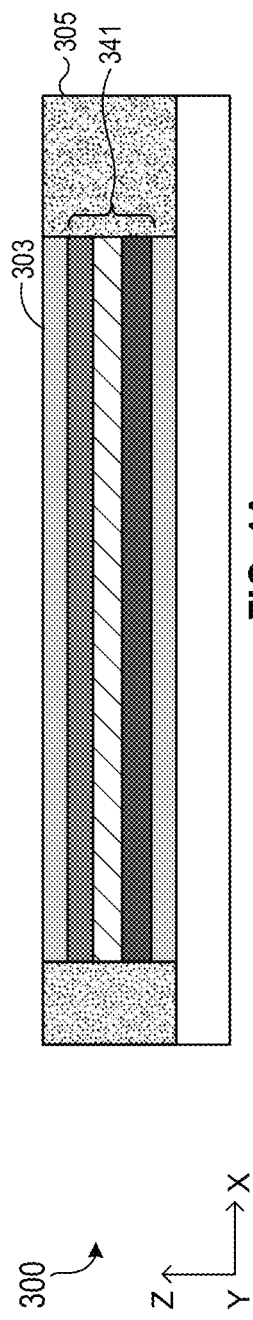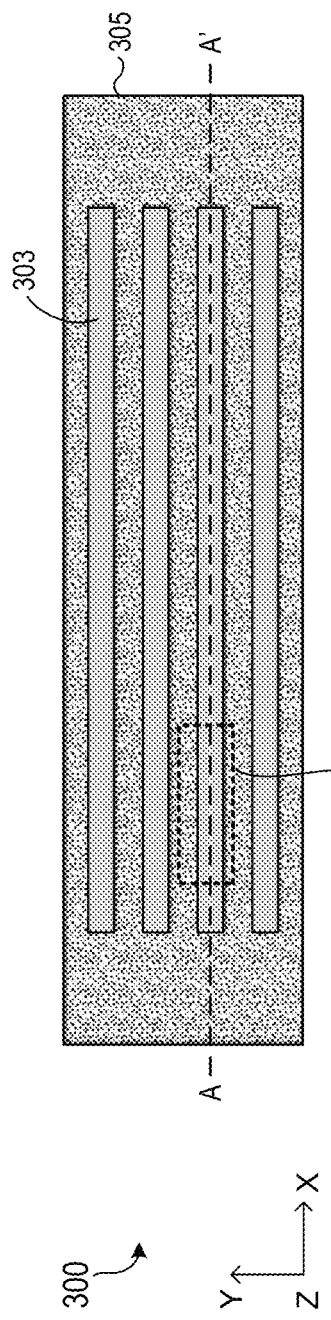

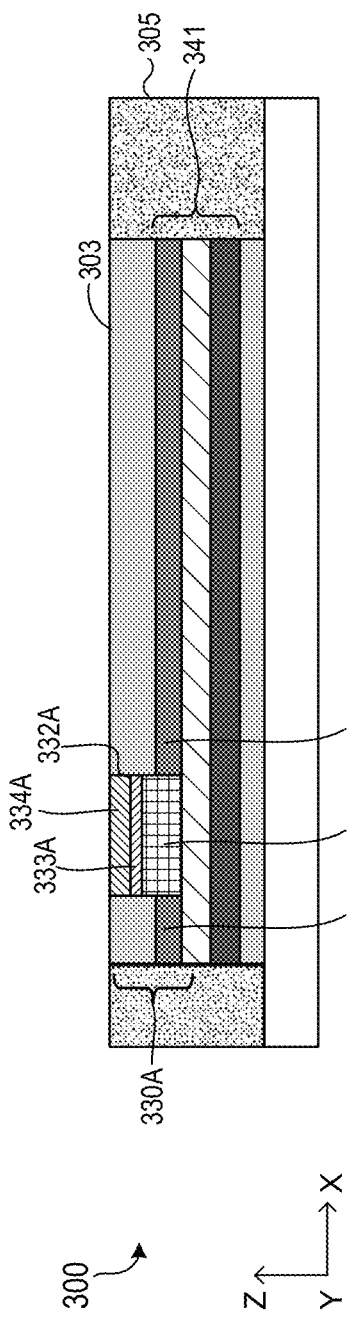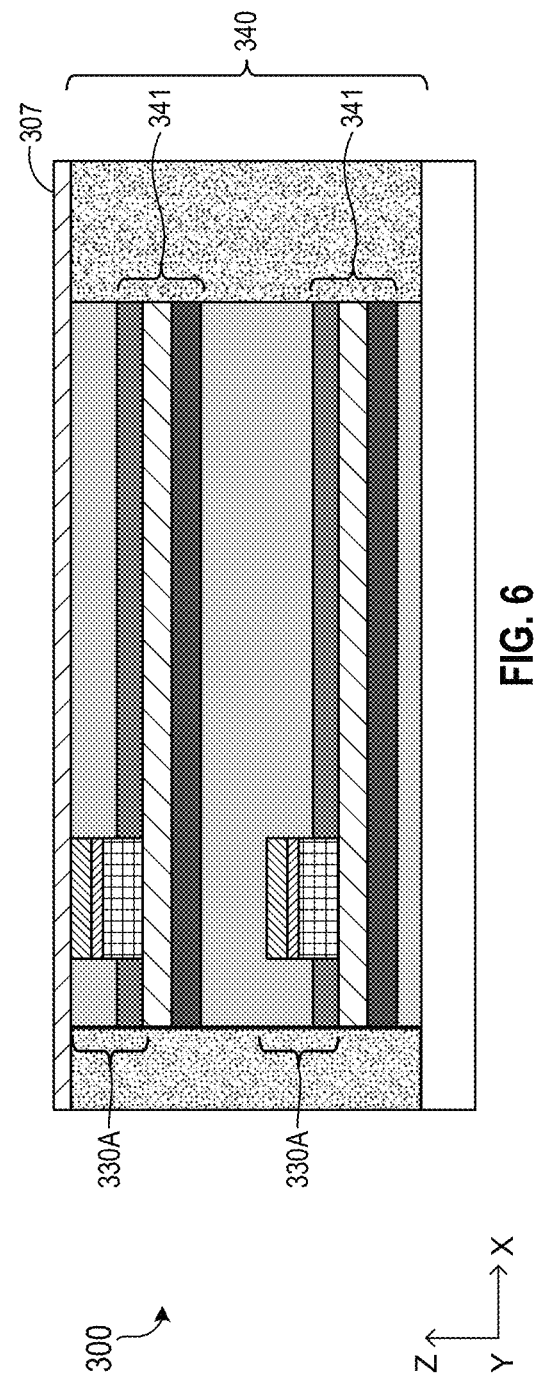

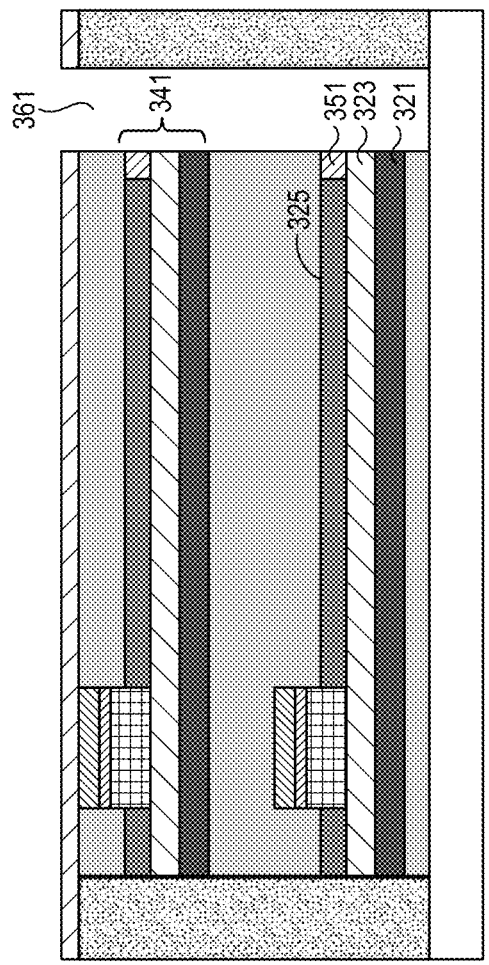
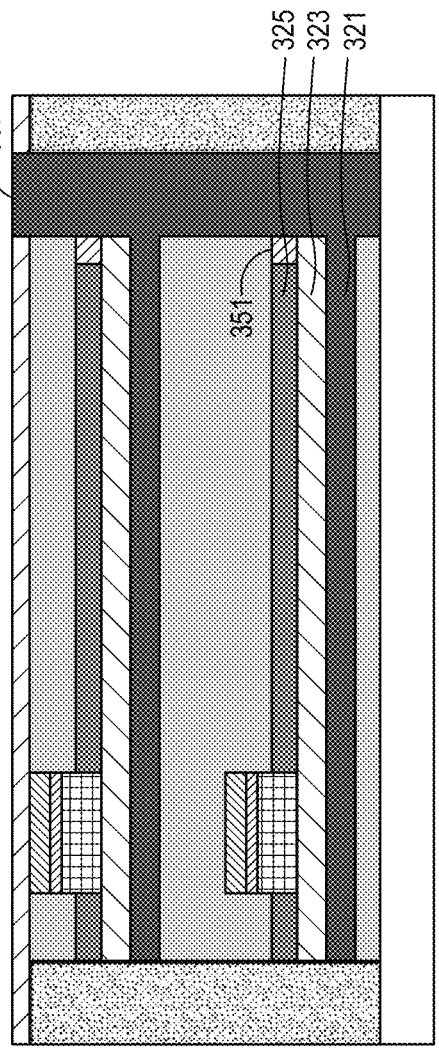
FIG. 7
FIG. 8

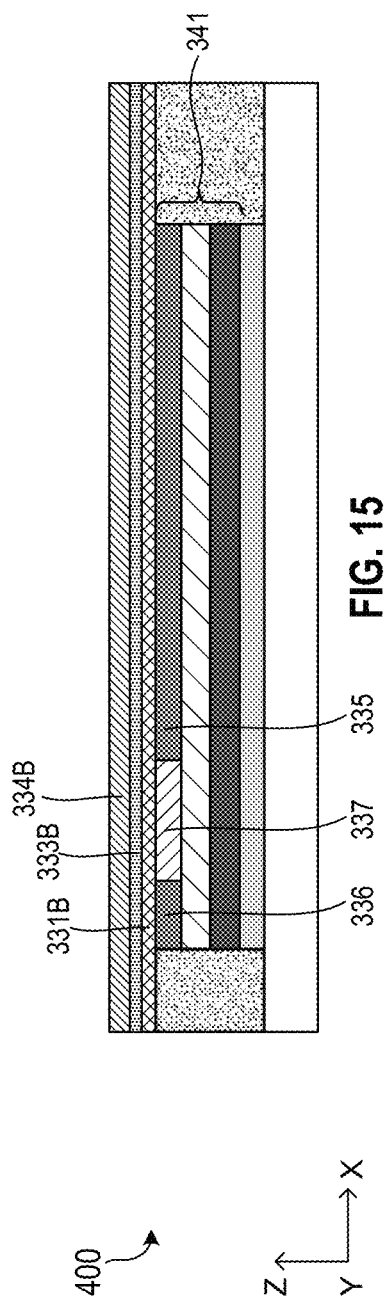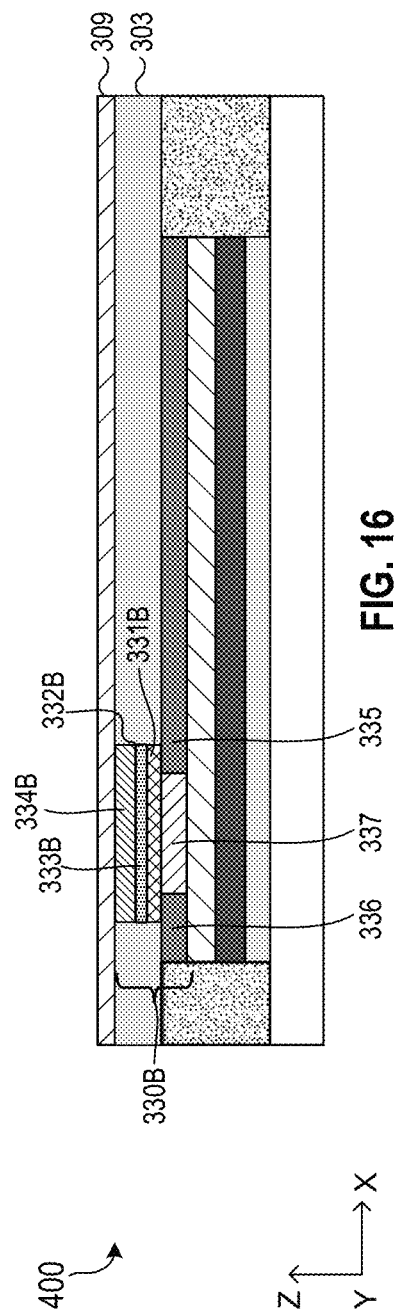

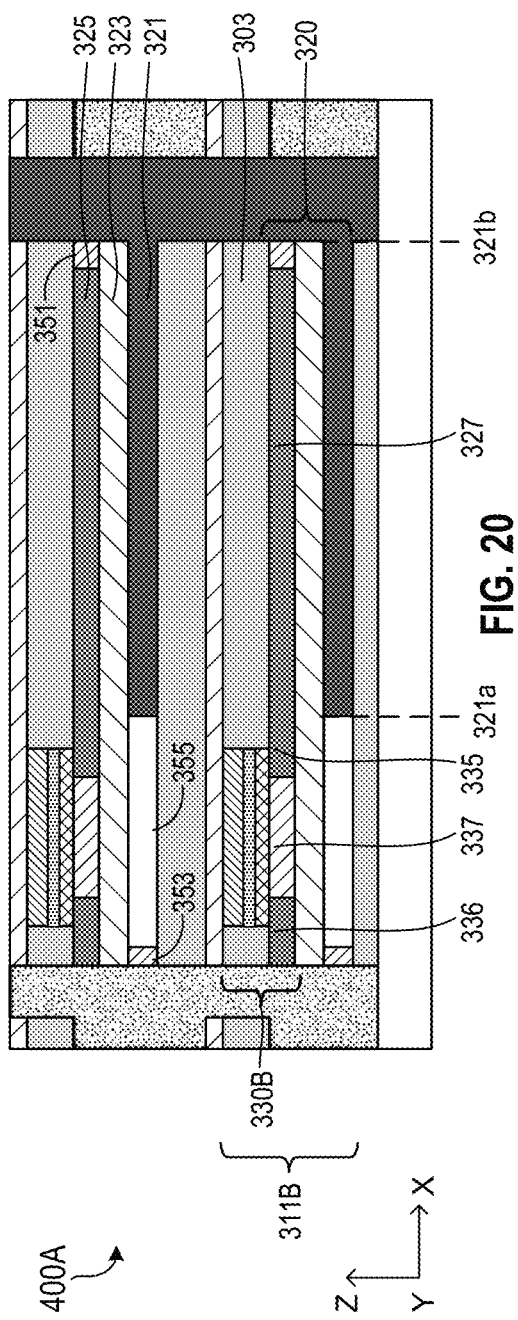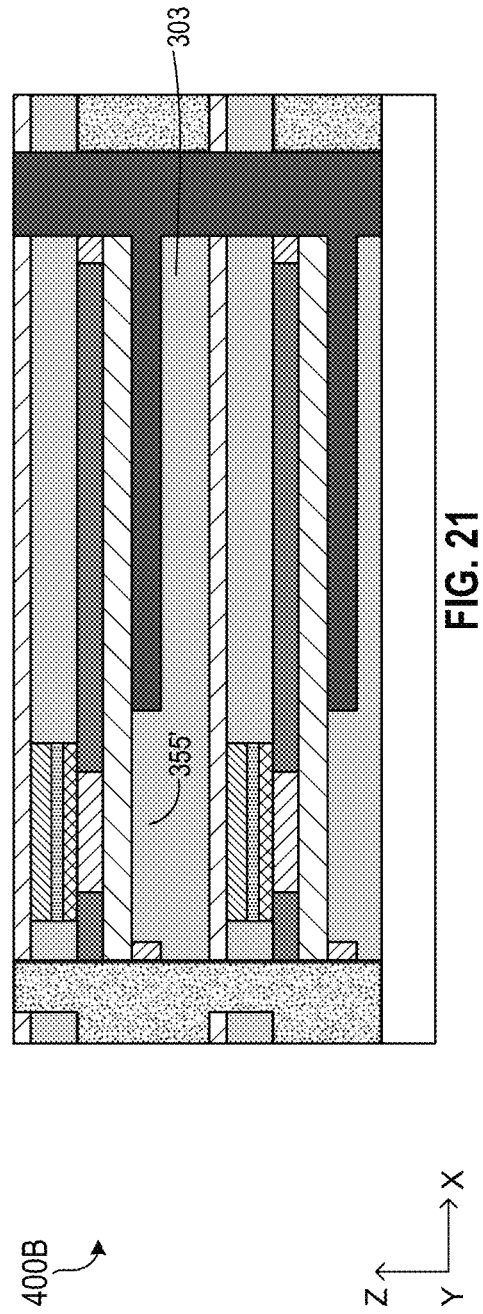

3D MEMORY WITH CELL STACKING USING AN IN-SITU CAPACITOR STACK

INCORPORATION BY REFERENCE

This present disclosure claims the benefit of U.S. Provisional Application No. 63/320,464, filed on Mar. 16, 2022, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of manufacturing the same.

According to a first aspect of the disclosure, a semiconductor device is provided. The semiconductor device includes a stack of dynamic random access memory (DRAM) cell units over a substrate in a vertical direction perpendicular to a working surface of the substrate. At least one DRAM cell unit includes a transistor and a capacitor. The capacitor includes a first metal layer, a capacitor dielectric layer positioned on the first metal layer, and a second metal layer positioned on the capacitor dielectric layer. The capacitor is elongated in a horizontal direction parallel to the working surface of the substrate. The first metal layer has a first end and a second end in the horizontal direction. The transistor includes a channel structure, and a gate structure positioned on the channel structure. The second metal layer extends in the horizontal direction beyond the first end of the first metal layer to form a drain region and a source region of the transistor. A common ground structure is configured to electrically connect to a plurality of first metal layers on respective second ends.

In some embodiments, a dielectric structure is positioned on the first end of the first metal layer and below the transistor.

In some embodiments, the dielectric structure is solid or air.

In some embodiments, the channel structure includes a semiconducting oxide.

In some embodiments, the drain region and the source region are separated by the channel structure.

In some embodiments, the channel structure includes a two-dimensional (2D) semiconductor material.

In some embodiments, the drain region and the source region are separated by a seed layer that is positioned below the 2D semiconductor material.

In some embodiments, the capacitor dielectric layer extends in the horizontal direction beyond the first end of the first metal layer and beyond the channel structure.

In some embodiments, the first metal layer, the capacitor dielectric layer and the second metal layer are configured to be etch-selective relative to each other.

In some embodiments, the semiconductor device further includes spacers that separate the common ground structure from a plurality of second metal layers.

According to a second aspect of the disclosure, a method of manufacturing a semiconductor device is provided. The method includes forming a stack of capacitors over a substrate in a vertical direction perpendicular to a working surface of the substrate. Each capacitor includes a respective first metal layer, a respective capacitor dielectric layer positioned on the respective first metal layer, and a respective second metal layer positioned on the respective capacitor dielectric layer. Each capacitor is elongated in a horizontal direction parallel to the working surface of the substrate. Each first metal layer has a respective first end and a respective second end in the horizontal direction. A stack of transistors is formed over the substrate in the vertical direction. Each transistor includes a respective channel structure, and a respective gate structure positioned on the respective channel structure. Each second metal layer extends in the horizontal direction beyond the respective first end of the respective first metal layer to form a respective drain region and a respective source region of the respective transistor. A common ground structure, which is configured to electrically connect to each first metal layer on the respective second end, is formed.

In some embodiments, a layer stack is formed over a substrate. The layer stack includes sub-stacks separated vertically from each other. Each sub-stack includes the respective first metal layer, the respective capacitor dielectric layer and the respective second metal layer. Each first metal layer, the respective capacitor dielectric layer and the respective second metal layer are configured to be etch-selective relative to each other.

In some embodiments, a respective hole is formed in each second metal layer by directionally etching each second metal layer. Each hole separates the respective source region and the respective drain region. The respective channel structure is formed in each hole.

In some embodiments, the forming the respective channel structure includes forming a respective semiconducting oxide in each hole.

In some embodiments, a respective hole is formed in each second metal layer by directionally etching each second metal layer. Each hole separates the respective source region and the respective drain region. A respective seed layer is formed in each hole. The respective channel structure is formed on each seed layer.

In some embodiments, the forming the respective channel structure includes forming a respective two-dimensional (2D) semiconductor material on each seed layer.

In some embodiments, an opening is formed along a sidewall of the layer stack to expose second ends of first metal layers. The opening is filled with the common ground structure to form the common ground structure.

In some embodiments, a respective indentation is formed by removing a respective end of each second metal layer via the opening. A respective spacer is formed in each indentation.

In some embodiments, a respective portion of each first metal layer below the respective transistor is replaced with a respective dielectric structure.

In some embodiments, the respective dielectric structure is solid or air.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 3, 4A, 5, 6, 7, 8, 9, 10, 11 and 12 show cross-sectional views of a semiconductor device at various intermediate steps of manufacturing, in accordance with some embodiments of the present disclosure.

FIG. 4B shows a top view of the semiconductor device in FIG. 4A in accordance with one embodiment of the present disclosure.

FIGS. 13, 14, 15, 16, 17, 18, 19, 20 and 21 show cross-sectional views of a semiconductor device at various intermediate steps of manufacturing, in accordance with some embodiments of the present disclosure.

DETAILED DESCRIPTION

Figure 1A:
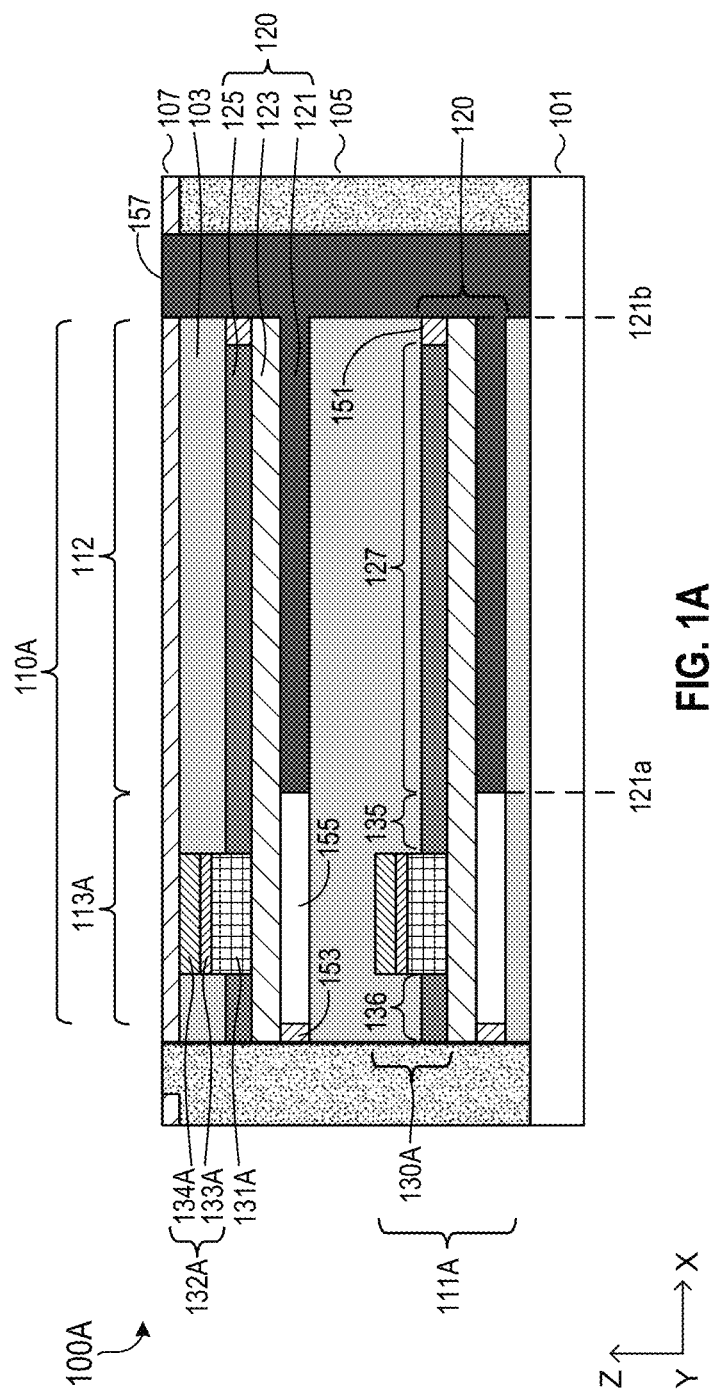
FIG. 1A shows a vertical cross-sectional view of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques disclosed herein include methods and designs for stacked semiconductor devices. Embodiments and benefits include 3D planarized 3D DRAM stacking using an in-situ stack (e.g. a 2D pass transistor+a parallel plate capacitor). Embodiments cover a 3D build with N=2 tall, but can have N tall. High performance pass transistor with good reliability with extremely low off state leakage current is achieved. Features include an isolated backside channel of the enhancement mode transistor (option 1—air gap, option 2—dielectric). A novel integration allows in-situ stacking to make the horizontal 3D memory cell, with examples showing both a conductive oxide (semiconducting oxide) channel and also a 2D semiconductor material integration for the pass transistor of the 1T1C (one transistor, one capacitor) horizontal memory cell. Embodiments can be made with conductive (semiconductive) channel element or as 2D semiconductor material as integration options. Embodiments can be N devices wide by N devices tall stacked 3D sequentially. Techniques herein can be used for all memory cells that use a 1T1C for the unit cell. Any deposited S/D and channel materials types can be used.

Techniques provided herein may use alternative semiconductors in the microfabrication of semiconductor devices. Such semiconductors herein can be alternatives to silicon, germanium, gallium arsenide, and other commonly used semiconductors. Semiconductors and structures herein can include semiconductive oxides (also known as semiconducting oxides or oxide semiconductors), semiconductive 2D materials (also known as 2D semiconductor materials), and other semiconductive materials. This includes semiconductors (materials) that can be formed at relatively low temperatures and without epitaxy.

Semiconductive materials herein may have properties similar to elemental semiconductor materials, and can be used to fabricate vertical stacks or planes of transistors. Note that given transistors within the vertical stacks can have channels with horizontal or vertical orientation relative to a working surface of the substrate. Certain materials, when combined with oxygen, may form new materials that exhibit semiconductor properties. For example, these semiconductor materials can turn "off" with low off-state leakage current or can become highly conductive under certain circumstances. In other words, such materials have an electrical conductivity value falling between an electrical conductor and an electrical insulator. Some examples of N-type semiconductive materials for channels include $In_2O_3$, $SnO_2$, InGaZnO, and ZnO. One example of a P-type semiconductive material for channels is SnO. Thus, a "semiconductive oxide" herein is an oxygen-containing material having semiconductor properties. Additionally, or alternatively, materials and channels may comprise a 2D material. Some example 2D materials for use in forming a channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. A "semiconductive 2D material" herein is a 2D material with semiconductor properties. The 2D materials described herein may be deposited by, for example, an atomic layer deposition (ALD) process and may be 5-15 angstroms thick, the thinness lending to their name-2D material. Other deposition techniques may also be used, including but not limited to, chemical vapor deposition (CVD), physical vapor deposition (PVD), and plasma-enhanced deposition techniques. The materials may be annealed during or after the device formation process to recrystallize or grow the crystals and thereby improve electrical characteristics. Thus forming a semiconductive material can include deposition and annealing. A "semiconductive material" herein can be any material with semiconductor properties. Such materials can include elements or compounds normally associated with dielectrics. Such materials can include compounds formed with or without requiring a seed layer, and can be formed at temperatures lower than about 500-600 degrees Celsius.

Semiconductive materials that can be formed/deposited on a substrate without requiring a seed layer and/or at processing temperatures lower than 600 degrees Celsius are beneficial in forming vertical stacks or planes of transistors (3D transistors). In contrast, semiconductors used to make conventional semiconductor devices are often formed by epitaxy, which requires a seed layer for growth. Requiring a seed layer can mean a need to uncover a particular material on a substrate that might be covered by many layers and structures. As can be appreciated, without needing to integrate access to a seed layer into a given fabrication flow, a semiconductive material can be easily formed over an existing plane of transistors to create an additional plane of transistors. Moreover, formation of conventional semiconductors can require high temperature deposition and annealing (greater than about 600 degree Celsius). After initial high temperature processing, additional materials are added that may not tolerate high temperature processing. This means that if a first plane of transistors is formed, adding a second plane of transistors that needs high temperature processing can damage the first plane of transistors, leading to device failure. Accordingly, semiconductor materials that can be formed at less than 600 degrees Celsius are desirable. Without requiring a seed layer or high temperature processing, semiconductive materials herein can be formed on many different surfaces, easily integrate with various fabrication flows, and help enable vertical stacking of transistors.

FIG. 1A shows a vertical cross-sectional view of a semiconductor device 100A in accordance with one embodiment of the present disclosure. The semiconductor device 100A includes a substrate 101 and a stack of dynamic random access memory (DRAM) cell units (hereinafter referred to as a memory stack 110A). The memory stack 110A includes a stack of capacitors (hereinafter referred to as a capacitor stack 112) and a stack of transistors (hereinafter referred to as a transistor stack 113A) adjacent to each other. The memory stack 110A includes a plurality of DRAM cell units stacked over the substrate 101 in the Z direction. Consider a DRAM cell unit 111A of the memory stack 110A for example. The DRAM cell unit 111A includes a capacitor 120 that is configured to be electrically coupled to a transistor 130A.

Specifically, the capacitor 120 includes a first metal layer 121, a capacitor dielectric layer 123 positioned on the first metal layer 121, and a second metal layer 125 positioned on the capacitor dielectric layer 123. Notably, the capacitor 120 is elongated in the X direction (relative to the Z direction). Shape of the capacitor 120 may vary, depending on specific design requirements. For example, the first metal layer 121, the capacitor dielectric layer 123 and the second metal layer 125 can be nanosheets. The first metal layer 121, the capacitor dielectric layer 123 and the second metal layer 125 can be configured to be etch-selective relative to each other. Accordingly, the first metal layer 121 and the second metal layer 125 can include different metal materials. Further, the first metal layer 121 has a first end 121a and a second end 121b in the X direction. The capacitor dielectric layer 123 and the second metal layer 125 can both extend beyond the first end 121a of the first metal layer 121 in the X direction, which will be explained in detail later.

The transistor 130A includes a channel structure 131A and a gate structure 132A positioned on the channel structure 131A. The gate structure 132A includes at least one gate dielectric 133A (such as a high-k dielectric) and at least one gate metal 134A (such as a work function metal). Note that the second metal layer 125 can extend in the X direction beyond the first end 121a of the first metal layer 121 to form source/drain (S/D) regions of the transistor 130A. For example, the second metal layer 125 can include a drain region 135 and a source region 136 of the transistor 130A. Accordingly, the channel structure 131A can be configured to have a current flow path in the X direction. In this example, the channel structure 131A includes a semiconducting oxide. The channel structure 131A is at least partially disposed in the second metal layer 125. As a result, the drain region 135 and the source region 136 are separated by the channel structure 131A.

As shown, the second metal layer 125 further includes a capacitor metal portion 127 which is connected to the drain region 135. That is, the capacitor 120 and the transistor 130A can be configured to electrically couple with each other. Thus, the DRAM cell unit 111A can be configured to function as a horizontal DRAM cell and be stacked in the Z direction.

The semiconductor device 100A can also include a common ground structure 157 that is configured to electrically connect to a plurality of first metal layers (e.g. 121) on respective second ends (e.g. 121b). The common ground structure 357 and the plurality of first metal layers may include a same metal material. Spacers 151 are disposed between second metal layers (e.g. 125) and the common ground structure 157 in order to electrically separate the second metal layers from the common ground structure 157.

Further, a dielectric structure 155 is positioned on the first end 121a of the first metal layer 121 and below the transistor 130A. Note that the dielectric structure 155 can extend beyond the channel structure 131A and the gate structure 132A in the X direction to define a length of the drain region 135 in the X direction. In one embodiment, the dielectric structure 155 includes air; that is, the dielectric structure 155 is an air gap. In another embodiment, the dielectric structure 155 is solid, i.e. including solid dielectric material such as silicon oxide. Particularly, the dielectric structure 155 and a dielectric material 103 may include a same dielectric material.

In some embodiments, the semiconductor device 100A can include dielectric materials, e.g. as shown by 103, 105, 123, 133A, 151, 153 and 155. The dielectric materials may also be referred to as isolation structures, isolation layers, diffusion breaks, gate dielectrics, capping layers, spacers, etc. depending on functions thereof. For example, the dielectric material 103 can separate capacitors (e.g. 120) of the capacitor stack 112 from each other as well as separate transistors (e.g. 130A) of the transistor stack 113A from each other. The dielectric materials may be the same as or different from each other. For example, dielectric materials 151 and 153 may be the same as each other. The dielectric materials 153 and 153 may be the same as each other. Alternatively, the dielectric material 153 may instead include a same metal material as the first metal layer 121.

In the example of FIG. 1A, the memory stack 110A includes two DRAM cell units 111A stacked in the Z direction. That is, the capacitor stack 112 includes two capacitors 120 stacked in the Z direction while the transistor stack 113A includes two transistors 130A stacked in the Z direction. It should be understood that the memory stack 110A can include any number of DRAM cell units 111A stacked in the Z direction. Moreover, DRAM cell units can be similar to the DRAM cell unit 111A while having some differences. For example, channel structures of the DRAM cell units can include different chemical compositions from one another. That is, the channel structures (e.g. 131A) can include different semiconductor materials, different dopants and/or different dopant concentration profiles. Similarly, second metal layers (e.g. 125) of capacitors can also include different chemical compositions from one another. Further, while not shown, the semiconductor device 100A can include any number of memory stacks (e.g. 110A) arranged in the XY plane.

Figure 1B:
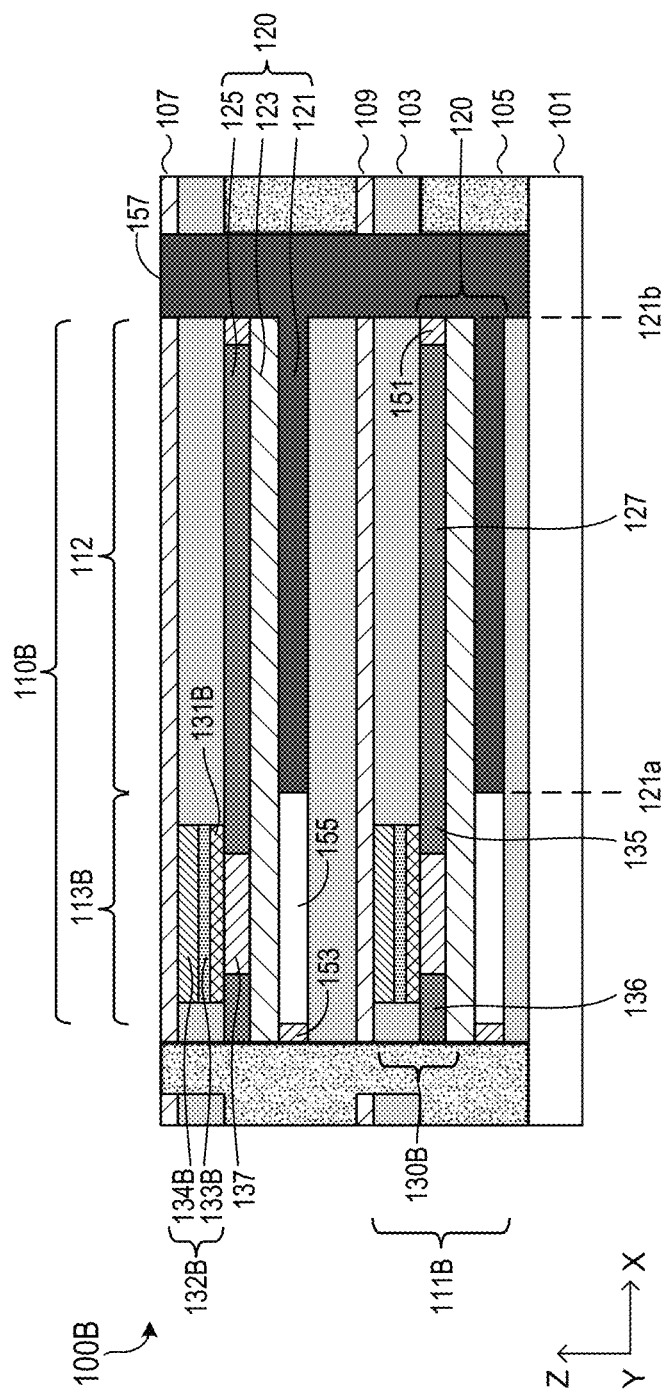
FIG. 1B shows a vertical cross-sectional view of a semiconductor device in accordance with another embodiment of the present disclosure.

FIG. 1B shows a vertical cross-sectional view of a semiconductor device 100B in accordance with another embodiment of the present disclosure. Since the embodiment of the semiconductor device 100B is similar to the embodiment of the semiconductor device 100A, descriptions herein will be provided with emphasis placed on difference. Note that similar or identical components are labeled with similar or identical numerals unless specified otherwise.

Herein, the semiconductor device 100B includes a memory stack 110B having a transistor stack 113B and the capacitor stack 112. Consider a DRAM cell unit 111B of the memory stack 110B for example. The DRAM cell unit 111B includes a transistor 130B having a channel structure 131B that is disposed above the second metal layer 125. A gate structure 132B is disposed on the channel structure 131B and includes at least one gate dielectric 133B (such as a high-k dielectric) and at least one gate metal 134B (such as a work function metal).

In the example of FIG. 1B, the channel structure 131B includes a two-dimensional (2D) semiconductor material formed over a seed layer 137. The seed layer 137 is disposed in the second metal layer 125. More specifically, the seed layer 137 is positioned between the drain region 135 and the source region 136. As illustrated, the channel structure 131B extends beyond the seed layer 137 in the X direction so as to be in contact with the drain region 135 and the source region 136. Similarly, the dielectric structure 155 extends beyond the seed layer 137 in the X direction and may further extend beyond the channel structure 131B in the X direction.

Figure 2:
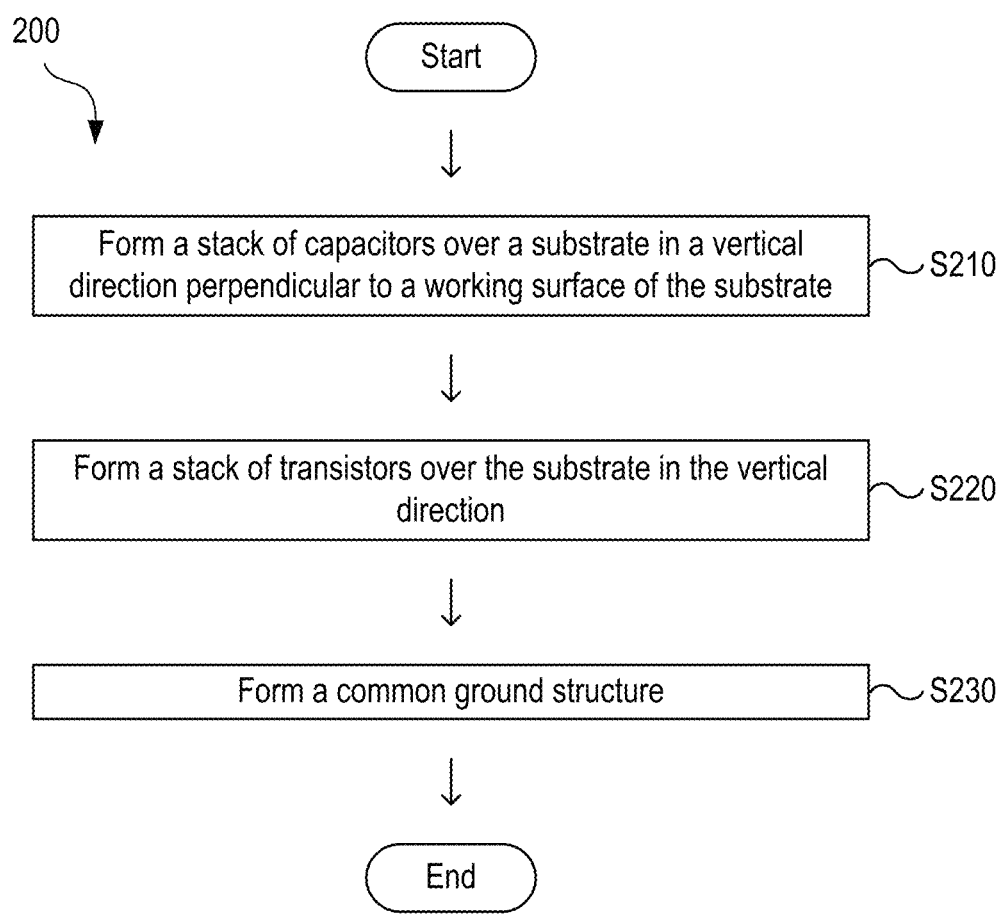
FIG. 2 shows a flow chart of a process for manufacturing a semiconductor device, in accordance with one embodiment of the present disclosure.

FIG. 2 shows a flow chart of a process 200 for manufacturing a semiconductor device (e.g. the semiconductor device 100A, the semiconductor device 100B and the like), in accordance with one embodiment of the present disclosure. The process 200 starts with Step S210 by forming a stack of capacitors over a substrate in a vertical direction perpendicular to a working surface of the substrate. Each capacitor can include a respective first metal layer, a respective capacitor dielectric layer positioned on the respective first metal layer, and a respective second metal layer positioned on the respective capacitor dielectric layer. Each capacitor is elongated in a horizontal direction parallel to the working surface of the substrate. Each first metal layer has a respective first end and a respective second end in the horizontal direction. The process 200 then proceeds to Step S220 by forming a stack of transistors over the substrate in the vertical direction. Each transistor can include a respective channel structure, and a respective gate structure positioned on the respective channel structure. Each second metal layer extends in the horizontal direction beyond the respective first end of the respective first metal layer to form a respective drain region and a respective source region of the respective transistor. At Step S330, a common ground structure, which is configured to electrically connect to each first metal layer on the respective second end, is formed.

Various embodiments will be described in relation to the drawings. There are several process flows that can be used with techniques herein. Flow A (e.g. FIGS. 3-10): any base substrate with conductive oxide channel for DRAM pass transistor sequential 3D memory stacking (2D pass transistor (conductive oxide)+parallel plate capacitor for memory cell). Option 1 (e.g. FIG. 11): leaving an air gap cavity beneath the conductive oxide region of the enhancement mode transistor. Option 2 (e.g. FIG. 12): filling in the cavity beneath the conductive oxide region of the enhancement mode transistor with a solid dielectric. Flow B (e.g. FIGS. 13-19): any base substrate with 2D semiconductor channel for DRAM pass transistor sequential 3D memory stacking (2D pass transistor (2D semiconductor material)+parallel plate capacitor for memory cell). Option 1 (e.g. FIG. 20): leaving an air gap cavity beneath the conductive oxide region of the enhancement mode transistor. Option 2 (e.g. FIG. 21): filling in the cavity beneath the conductive oxide region of the enhancement mode transistor with a dielectric.

FIGS. 3, 4A, 5, 6, 7, 8, 9 and 10 show cross-sectional views of a semiconductor device 300 at various intermediate steps of manufacturing, in accordance with some embodiments of the present disclosure. In FIG. 3, the semiconductor device 300 includes a substrate 301 and a sub-stack 341 over the substrate 301. A dielectric material 303 is deposited below and above the sub-stack 341. The sub-stack 341 includes a first metal layer 321, a capacitor dielectric layer 323 on the first metal layer 321 and a second metal layer 325 on the capacitor dielectric layer 323. Thus, a pair of metal layers (e.g. nanosheets) are formed with a capacitor dielectric separating the pair of metal layers. Particularly, the first metal layer 321, the capacitor dielectric layer 323 and the second metal layer 325 are configured to be etch-selective relative to each other. Accordingly, the first metal layer 321 and the second metal layer 325 include different metal materials.

Note that the substrate 301 can correspond to the substrate 101. The dielectric material 303 can correspond to the dielectric material 103. The first metal layer 321 can be used to form the first metal layer 121. The capacitor dielectric layer 323 can correspond to the capacitor dielectric layer 123. The second metal layer 325 can be used to form the second metal layer 125.

In FIG. 4A, the sub-stack 341 is divided into independent sub-stacks that are separated from each other by a dielectric material 305 and are surrounded by the dielectric material 305. This can for example be accomplished by isolation mask etch, photoresist strip and then isolation deposition, followed by chemical-mechanical polishing (CMP) (note this step also defines the W/L dimensions).

In one embodiment, FIG. 4B shows a top view of the semiconductor device 300 in FIG. 4A while FIG. 4A can show a vertical cross-sectional view taken along the line cut AA'. Note that the dielectric material 303 is divided into four sections arranged in the Y direction. While not shown, N=4 independent sub-stacks (e.g. future memory cells, i.e. pass Transistor+capacitor) are positioned below the dielectric material 303. It should be understood that the sub-stack 341 can be divided into any number of independent sub-stacks arranged in the XY plane.

In FIG. 5, a channel structure 331A is formed in the second metal layer 325. A gate structure 332A is formed on the channel structure 331A. In this example, the channel structure 331A includes a semiconducting oxide. The gate structure 332A includes at least one gate dielectric 333A (such as a high-k dielectric) and at least one gate metal 334A (such as a work function metal). The second metal layer 325 can be configured to include source/drain regions for the channel structure 331A, e.g. a drain region 335 and a source region 336 positioned on opposing ends of the channel structure 331A. As a result, a transistor 330A is formed.

Note that the channel structure 331A can correspond to the channel structure 131A. The gate structure 332A can correspond to the gate structure 132A. The at least one gate dielectric 333A can correspond to the at least one gate dielectric 133A. The at least one gate metal 334A can correspond to the at least one gate metal 134A. The drain region 335 can correspond to the drain region 135. The source region 336 can correspond to the source region 136. The transistor 330A can correspond to the transistor 130A.

In some embodiments, in order to form the transistor 330A, a photoresist mask (not shown) can be used to directionally etch through the dielectric material 303 and the second metal layer 325 to form an opening (not shown). The photoresist mask is then removed, and a semiconducting oxide (e.g. 331A) is deposited with overburden removed. Subsequently, the semiconducting oxide is etched back to reduce a height of the semiconducting oxide, and then high K deposition (e.g. 333A) is executed, followed by metal deposition (e.g. 334A) to form a gate electrode.

In FIG. 6, a layer stack 340 is formed, which includes sub-stacks 341 stacked in the Z direction and vertically separated from each other by the dielectric material 303. For example, processes shown in FIGS. 3-5 can be repeated to create N=2 stack (note such processes may be sequenced N times to make a stack N tall). After a desired number of device layers have been formed, a capping layer 307 (e.g. a hardmask) can be formed on over the layer stack 340.

In FIG. 7, an opening 361 is formed to uncover the sub-stacks 341. The second metal layer 325 is then indent-etched to remove end portions, which are replaced with spacers 351. For example, an etch mask (not shown) can be used to open up a right side of capacitor end, and the second metal layer 325 is then indent-etched, followed by dielectric deposition (e.g. 351) and etch-aligned to the hard mask (e.g. 307). Note that the spacers 351 can correspond to the spacers 151.

In FIG. 8, a common ground structure 357 is formed in the opening 361. For example, metal deposition can be executed, followed by CMP. The common ground structure 357 can be configured to function as a common ground for bottom parallel plates (e.g. 321). The common ground structure 357 and the first metal layer(s) 321 may include a same metal material. Note that the common ground structure 357 can correspond to the common ground structure 157.

Figure 9:
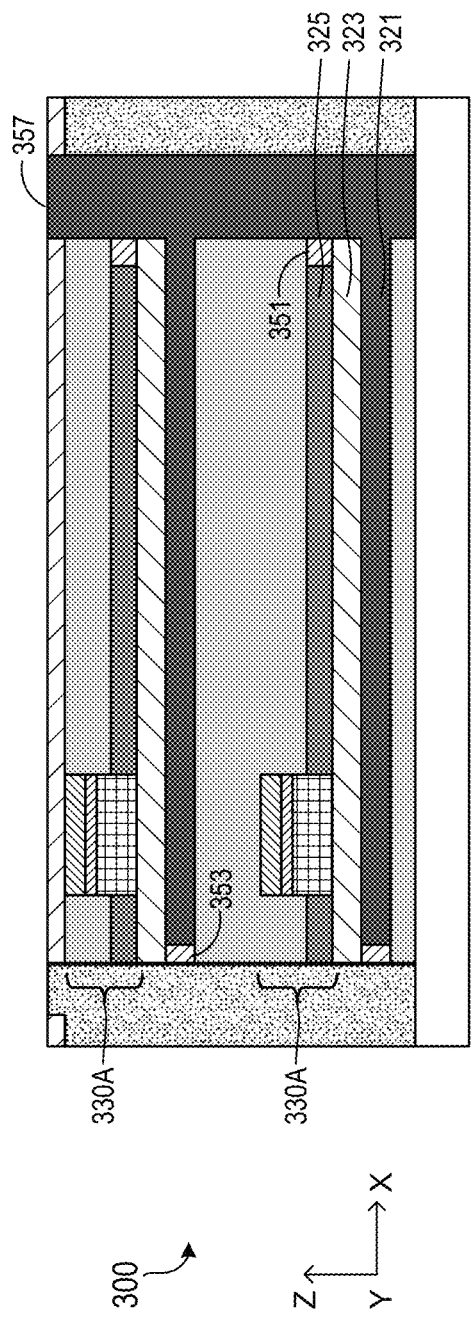

In FIG. 9, spacers 353 are formed on end portions of the first metal layers 321. For example, the spacers 353 can be formed by processes similar to FIGS. 7-8. Specifically, an etch mask (not shown) can be used to directionally etch the dielectric material 305 to open a source side of access transistor, i.e. uncovering the transistors 330A from an opposing side relative to the common ground structure 357. The etch mask is then removed, and the first metal layers 321 are indent-etched. Then, dielectric deposition (e.g. 353) is executed and etch aligned to the hard mask (e.g. 307) before isolation deposition (e.g. 305) followed by overburden removal (e.g. CMP). Note that the spacers 353 can correspond to the dielectric material 153. In some embodiments, formation of the spacers 353 may not be needed.

Figure 10:
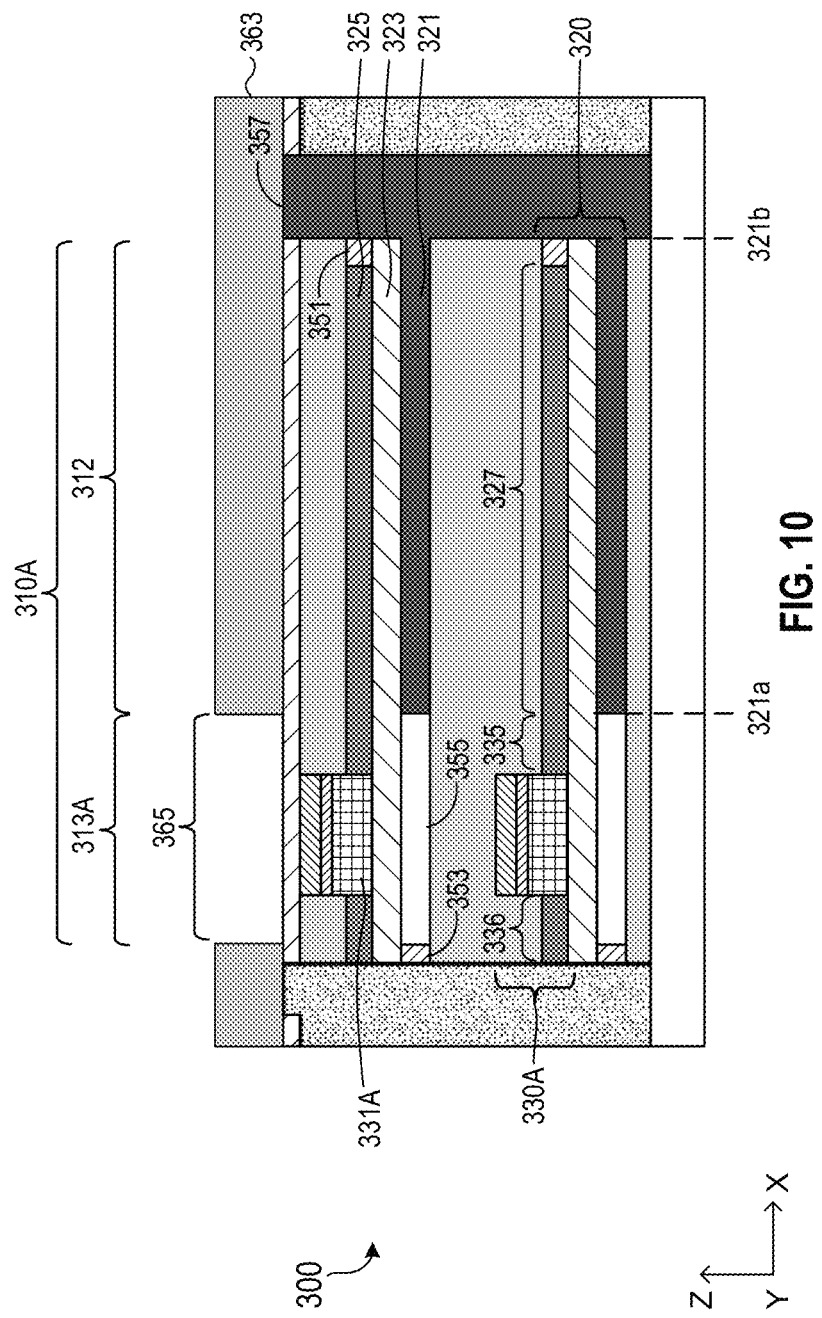
Figure 11:
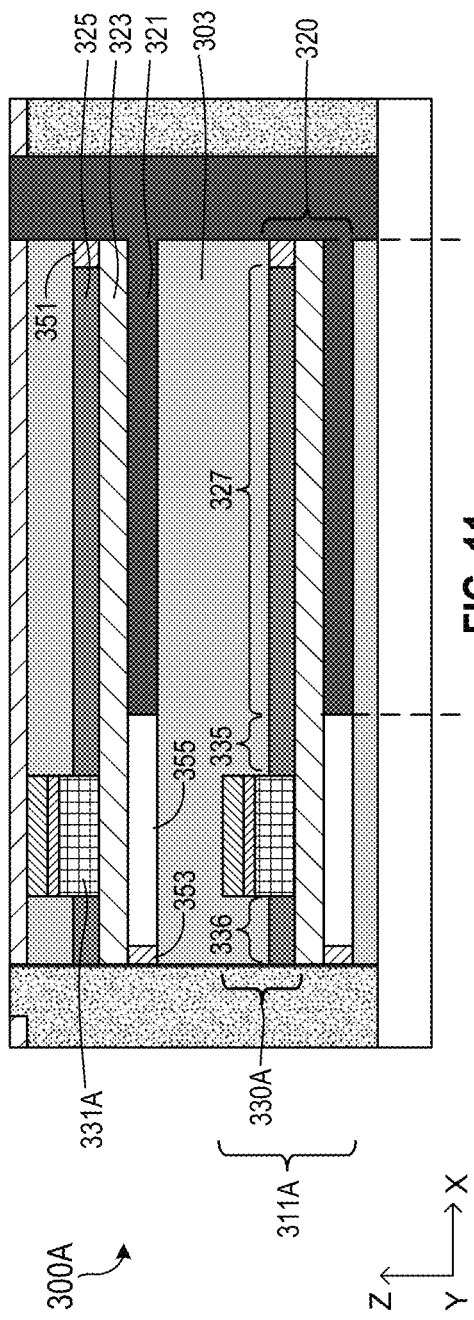

In FIG. 10, an opening 365 is formed using a mask 363, such as a photoresist mask or an etch mask. The opening 365 can correspond to an area represented by a rectangle BB' in FIG. 4B. That is, the opening 365 uncovers sidewalls of the transistors 330A from two opposing sides in the Y direction. Consequently, a portion of the first metal layer 321 below the channel structure 331A can be removed via the opening 365, for example by selectively etching chemistry. Therefore, an air gap 355 is formed on a first end 321a of the first metal layer 321 and below the channel structure 331A. The common ground structure 357 is positioned on a second end 321b of the first metal layer 321. The air gap 355 extends beyond the channel structure 331A in the X direction.

As a result, a capacitor 320 is formed adjacent to the transistor 330A. Particularly, the second metal layer 325 includes a capacitor metal portion 327 connected to the drain region 335 of the transistor 330A. Therefore, a capacitor stack 312 and a transistor stack 313A are formed; a memory stack 310A is formed. Note that the capacitor 320 is an in-situ capacitor. That is, the first metal layer 321, the capacitor dielectric layer 323 and the second metal layer 325 can be configured to function as a capacitor, starting from FIG. 3. Formation of the air gap 355 can functionally divide the second metal layer 325 into the drain region 335 and the capacitor metal portion 327, without physically dividing the second metal layer 325.

It should be understood that the capacitor 320 can correspond to the capacitor 120. The capacitor metal portion 327 can correspond to the capacitor metal portion 127. The capacitor stack 312 can correspond to the capacitor stack 112. The transistor stack 313A can correspond to the transistor stack 113A. The memory stack 310A can correspond to the memory stack 110A.

Subsequently, the opening 365 is filled with dielectric material such as the dielectric material 303, and the mask 363 is removed. Therefore, the semiconductor device 300 can eventually become the semiconductor device 100A. In one embodiment such as FIG. 11, an air gap cavity is left beneath the conductive oxide region of the enhancement mode transistor. That is, the air gap 355 remains on the first end 321a of the first metal layer 321 and below the channel structure 331A. The air gap 355 can correspond to one embodiment of the dielectric structure 155. Thus, a semiconductor device 300A in FIG. 11 can correspond to one embodiment of the semiconductor device 100A.

Figure 12:
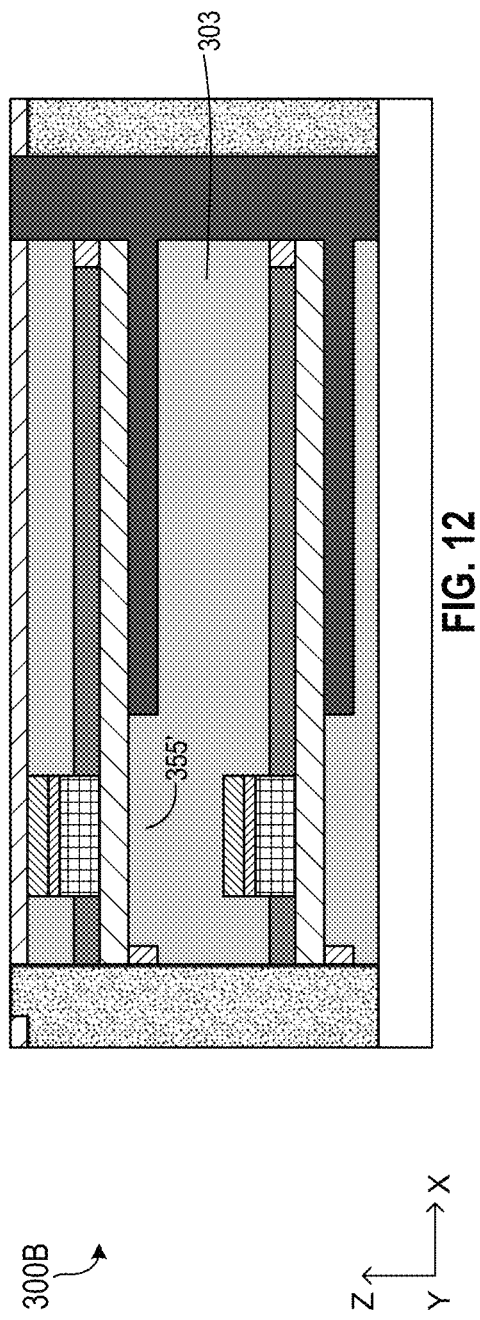

In another embodiment such as FIG. 12, a dielectric fill of the cavity is executed beneath the conductive oxide region of the enhancement mode transistor. That is, dielectric material 355' is used to fill the air gap 355. The dielectric material 355' and the dielectric material 303 can include a same dielectric material for example. The dielectric material 355' can correspond to another embodiment of the dielectric structure 155. Thus, a semiconductor device 300B in FIG. 12 can correspond to another embodiment of the semiconductor device 100A.

FIGS. 13, 14, 15, 16, 17, 18 and 19 show cross-sectional views of a semiconductor device 400 at various intermediate steps of manufacturing, in accordance with some embodiments of the present disclosure. Note that similar or identical components are labeled with similar or identical numerals unless specified otherwise. Any base substrate with 2D Semiconductor channel for DRAM pass transistor sequential 3D memory stacking (2D pass transistor (2D semiconductor material)+parallel plate capacitor for memory cell). Option 1 (e.g. FIG. 20): leaving an air gap cavity beneath the conductive oxide region of the enhancement mode transistor. Option 2 (e.g. FIG. 21): filling in the cavity beneath the conductive oxide region of the enhancement mode transistor with a dielectric.

Figure 13:
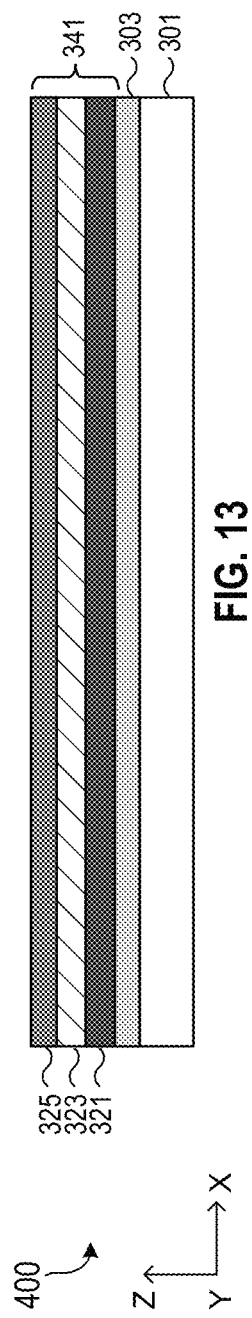

As shown in FIG. 13, the semiconductor device 400 includes the substrate 301 and the sub-stack 341 formed over the substrate 301. The dielectric material 303 is formed between the substrate 301 and the sub-stack 341.

Figure 14:
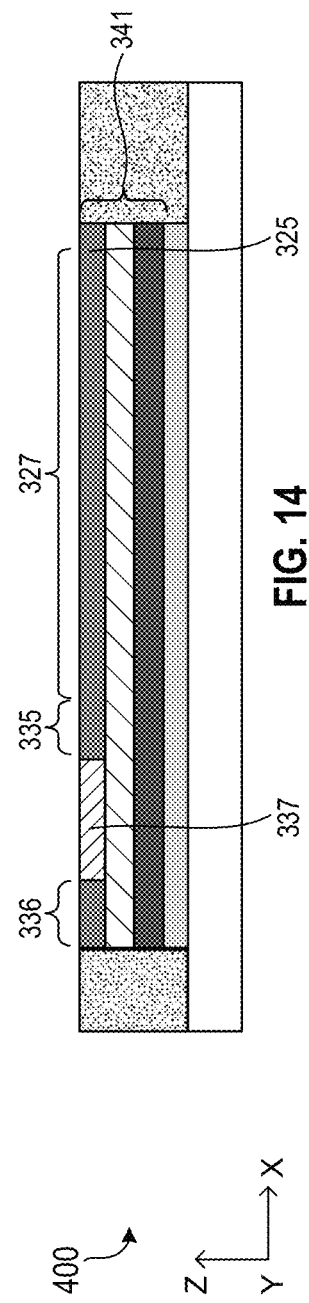

While not shown in FIG. 14, the sub-stack 341 is divided into independent sub-stacks, similar to FIGS. 4A-4B. A seed layer 337 is formed in the second metal layer 325 in independent sub-stack, for example by directionally etching the second metal layer 325, followed by 2D seed material layer deposition and CMP. The seed layer 337 is positioned between the drain region 335 and the source region 336. Note that the seed layer 337 can correspond to the seed layer 137.

In FIG. 15, a 2D semiconductor material (e.g. 331B), at least one gate dielectric 333B and at least one gate metal 334B can be sequentially formed over the seed layer 337. For example, a stack of 2D materials/high K dielectric/metal can be formed. While the stack is shown to cover the sub-stack 341 and the dielectric material 305, it should be understood that the 2D semiconductor material may alternatively only cover the seed layer 337 and extend outwardly from the seed layer 337.

In FIG. 16, a directional etching process is executed to define a channel structure 331B and a gate structure 332B. As a result, a transistor 330B can be formed. For example, an etch mask (not shown) can be used to etch the stack to define gate electrode region of pass transistor, essentially blocking the gate electrode region and etching uncovered portions, followed by dielectric deposition (e.g. 303) and overburden removal, and then hard mask deposition (e.g. 309).

Note that the channel structure 331B can correspond to the channel structure 131B. The gate structure 332B can correspond to the gate structure 132B. The at least one gate dielectric 333B can correspond to the at least one gate dielectric 133B. The at least one gate metal 334B can correspond to the at least one gate metal 134B. The transistor 330B can correspond to the transistor 130B.

Figure 17:
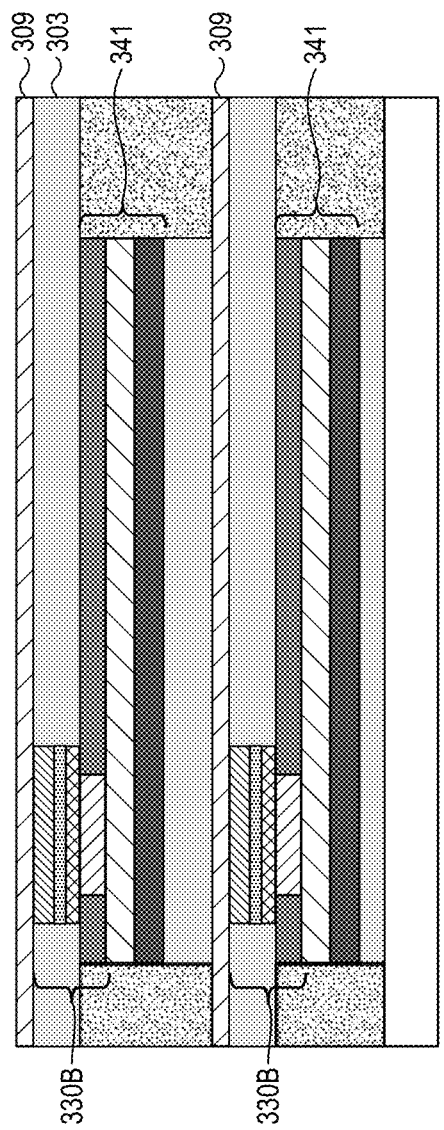

In FIG. 17, sub-stacks 341 are formed and stacked in the Z direction and vertically separated from each other by dielectric materials 303 and 309. For example, processes shown in FIGS. 13-16 can be repeated to create N=2 stack (note such processes may be sequenced N times to make a stack N tall). After a desired number of device layers have been formed, a capping layer such as a hardmask (e.g. 309) can be formed.

Figure 18:
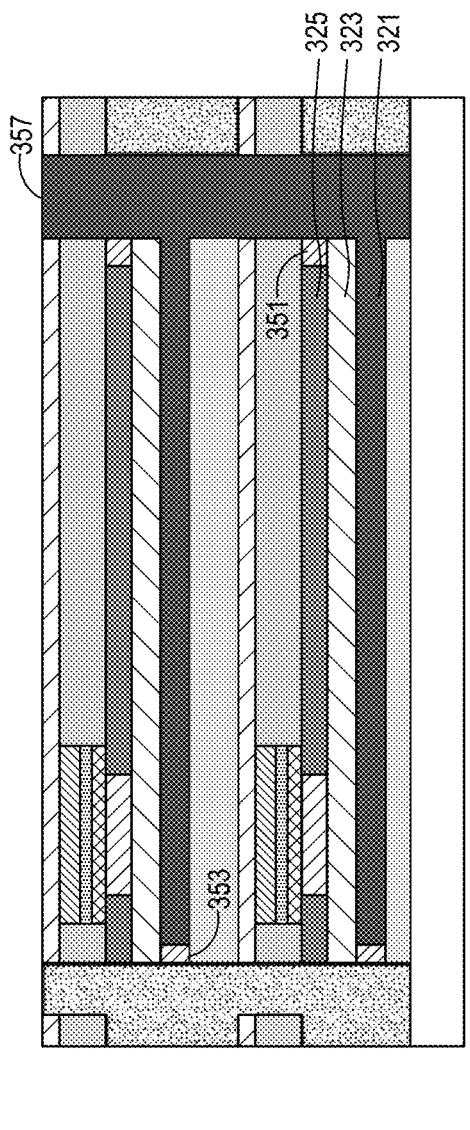

In FIG. 18, the spacers 351 and the common ground structure 357 can be formed, similar to FIGS. 7-8. The spacers 353 can be formed, similar to FIG. 9. (Alternatively, the spacers 353 may not need to be formed.) Similar processes have been described above and will be omitted herein for simplicity purposes.

Figure 19:
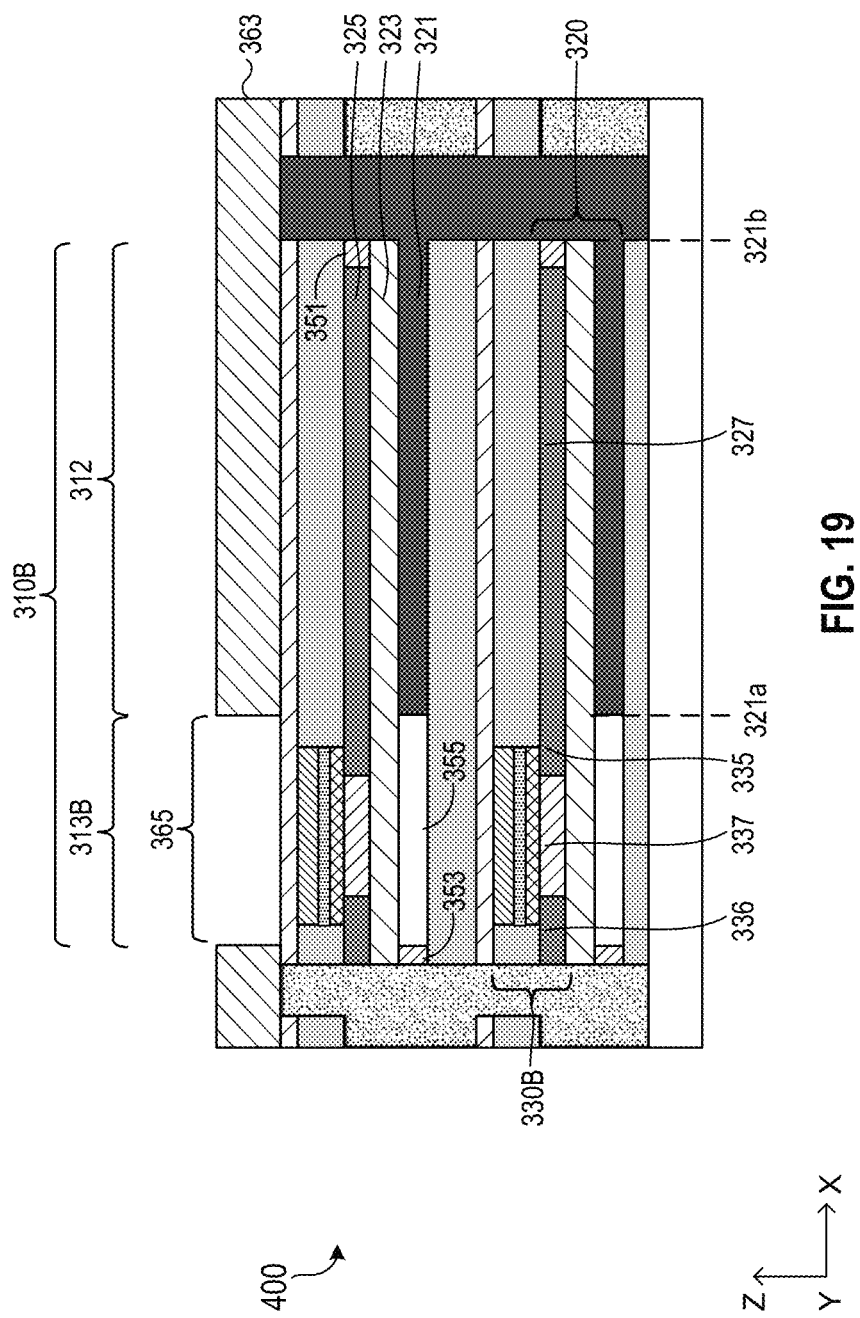

In FIG. 19, the opening 365 is formed using the mask 363. Similar to FIG. 10, the opening 365 uncovers sidewalls of the transistors 330B from two opposing sides in the Y direction. Consequently, a portion of the first metal layer 321 below the channel structure 331B can be removed via the opening 365, for example by selectively etching chemistry. Therefore, the air gap 355 is formed on the first end 321a of the first metal layer 321 and below the channel structure 331B. The air gap 355 extends beyond the seed layer 337 in the X direction and may further extend beyond the channel structure 331B in the X direction.

As a result, the capacitor 320 is formed adjacent to the transistor 330B. Therefore, the capacitor stack 312 and a transistor stack 313B are formed; a memory stack 310B is formed. It should be understood that the transistor stack 313B can correspond to the transistor stack 113B. The memory stack 310B can correspond to the memory stack 110B.

Subsequently, the opening 366 is filled with dielectric material such as the dielectric material 303, and the mask 364 is removed. Therefore, the semiconductor device 400 can eventually become the semiconductor device 100B. In one embodiment such as FIG. 20, an air gap cavity is left beneath the conductive oxide region of the enhancement mode transistor. That is, the air gap 355 remains on the first end 321a of the first metal layer 321 and below the channel structure 331A. Thus, a semiconductor device 400A in FIG. 20 can correspond to one embodiment of the semiconductor device 100B.

In another embodiment such as FIG. 12, a dielectric fill of the cavity is executed beneath the conductive oxide region of the enhancement mode transistor. That is, the dielectric material 355' is used to fill the air gap 355. The dielectric material 355' and the dielectric material 303 can include a same dielectric material. Thus, a semiconductor device 400B in FIG. 21 can correspond to another embodiment of the semiconductor device 100B.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising: a stack of dynamic random access memory (DRAM) cell units over a substrate in a vertical direction perpendicular to a working surface of the substrate, wherein at least one DRAM cell unit comprises a transistor and a capacitor, wherein the capacitor comprises: a first metal layer, a capacitor dielectric layer positioned on the first metal layer, and a second metal layer positioned on the capacitor dielectric layer, where the capacitor is elongated in a horizontal direction parallel to the working surface of the substrate, and the first metal layer has a first end and a second end in the horizontal direction, wherein the transistor comprises: a channel structure, and a gate structure positioned on the channel structure, where the second metal layer extends in the horizontal direction beyond the first end of the first metal layer to form a drain region and a source region of the transistor; and a common ground structure configured to electrically connect to a plurality of first metal layers on respective second ends; wherein: the capacitor dielectric layer extends in the horizontal direction beyond the first end of the first metal layer and beyond the channel structure.

2. The semiconductor device of claim 1, further comprising:
a dielectric structure positioned on the first end of the first metal layer and below the transistor.

3. The semiconductor device of claim 2, wherein:
the dielectric structure is solid or air.

4. The semiconductor device of claim 1, wherein:
the channel structure comprises a semiconducting oxide.

5. The semiconductor device of claim 4, wherein:
the drain region and the source region are separated by the channel structure.

6. The semiconductor device of claim 1, wherein:
the channel structure comprises a two-dimensional (2D) semiconductor material.

7. The semiconductor device of claim 6, wherein:
the drain region and the source region are separated by a seed layer that is positioned below the 2D semiconductor material.

8. The semiconductor device of claim 1, wherein:
the first metal layer, the capacitor dielectric layer and the second metal layer are configured to be etch-selective relative to each other.

9. The semiconductor device of claim 1, further comprising:
spacers that separate the common ground structure from a plurality of second metal layers.

10. A method of manufacturing a semiconductor device, the method comprising: forming a stack of capacitors over a substrate in a vertical direction perpendicular to a working surface of the substrate, wherein each capacitor comprises: a respective first metal layer, a respective capacitor dielectric layer positioned on the respective first metal layer, and a respective second metal layer positioned on the respective capacitor dielectric layer, where each capacitor is elongated in a horizontal direction parallel to the working surface of the substrate, and each first metal layer has a respective first end and a respective second end in the horizontal direction; forming a stack of transistors over the substrate in the vertical direction, wherein each transistor comprises: a respective channel structure, and a respective gate structure positioned on the respective channel structure, where each second metal layer extends in the horizontal direction beyond the respective first end of the respective first metal layer to form a respective drain region and a respective source region of the respective transistor; and forming a common ground structure configured to electrically connect to each first metal layer on the respective second end; wherein: the respective capacitor dielectric layer extends in the horizontal direction beyond the respective first end of the first metal layer and beyond the respective channel structure.

11. The method of claim 10, further comprising:
forming a layer stack over a substrate, the layer stack including sub-stacks separated vertically from each other,
wherein each sub-stack comprises the respective first metal layer, the respective capacitor dielectric layer and the respective second metal layer, and
each first metal layer, the respective capacitor dielectric layer and the respective second metal layer are configured to be etch-selective relative to each other.

12. The method of claim 11, further comprising:
forming a respective hole in each second metal layer by directionally etching each second metal layer, wherein each hole separates the respective source region and the respective drain region; and
forming the respective channel structure in each hole.

13. The method of claim 12, wherein the forming the respective channel structure comprises:
forming a respective semiconducting oxide in each hole.

14. The method of claim 11, further comprising:
forming a respective hole in each second metal layer by directionally etching each second metal layer, wherein each hole separates the respective source region and the respective drain region;
forming a respective seed layer in each hole; and forming the respective channel structure on each seed layer.

15. The method of claim 14, wherein the forming the respective channel structure comprises:
forming a respective two-dimensional (2D) semiconductor material on each seed layer.

16. The method of claim 11, further comprising:
forming an opening along a sidewall of the layer stack to expose second ends of first metal layers; and
filling the opening with the common ground structure to form the common ground structure.

17. The method of claim 16, further comprising:
forming a respective indentation by removing a respective end of each second metal layer via the opening; and
forming a respective spacer in each indentation.

18. The method of claim 11, further comprising:
replacing a respective portion of each first metal layer below the respective transistor with a respective dielectric structure.

19. The method of claim 18, wherein:
the respective dielectric structure is solid or air.

* * * * *